US006713359B1

United States Patent
Mizushima et al.

(10) Patent No.: US 6,713,359 B1
(45) Date of Patent: *Mar. 30, 2004

(54) SEMICONDUCTOR DEVICE AND METHOD OF MANUFACTURING THE SAME INCLUDING RAISED SOURCE/DRAIN COMPRISING SIGE OR SIC

(75) Inventors: Ichiro Mizushima, Yokohama (JP); Shigehiko Saida, Yokohama (JP); Takeo Furuhata, Yokohama (JP); Yoshitaka Tsunashima, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/564,191

(22) Filed: May 4, 2000

(30) Foreign Application Priority Data

May 6, 1999 (JP) .............................. 11-125746
Apr. 28, 2000 (JP) ....................... 2000-130412

(51) Int. Cl.[7] ................... H01L 21/336; H01L 21/3205; H01L 21/4763
(52) U.S. Cl. ................... 438/300; 438/585; 438/592
(58) Field of Search .................. 438/300, 585, 438/592

(56) References Cited

U.S. PATENT DOCUMENTS 4,968,384 A * 11/1990 Asano
5,124,276 A * 6/1992 Samata et al.
5,525,828 A * 6/1996 Bassous et al. ............. 257/457
5,967,794 A * 10/1999 Kodama
6,124,627 A * 9/2000 Rodder et al. .............. 438/300
6,319,782 B1 * 11/2001 Nakabayashi .............. 438/300

FOREIGN PATENT DOCUMENTS

JP 04-106980 4/1992
JP 4-372125 12/1992

OTHER PUBLICATIONS

F. Mieno et al., "Selected Doped Polysilicon Growth: Effect of Carbon on the Selective Doped Silicon Film Growth", *Journal of Electrochemical Society*, vol. 134, p. 2862 (1987).

* cited by examiner

Primary Examiner—John F. Niebling
Assistant Examiner—Ron Pompey
(74) Attorney, Agent, or Firm—Finnegan, Henderson, Farabow, Garrett & Dunner, L.L.P.

(57) ABSTRACT

SiGe or SiC films are selectively grown on source/drain regions, followed by selectively growing silicon. A monocrystalline film having a high dislocation density or a polycrystalline film can be grown in growing the silicon film by making the C or Ge concentration higher than a predetermined level. The silicon layer on each of the source/drain regions is not monocrystalline or, even if monocrystalline, has a high density of dislocation. Therefore, the silicon film formed thereon is in the form of a monocrystalline silicon film having a high dislocation density or a polycrystalline silicon film. It is possible to suppress an impurity diffusion to reach a deep region caused by channeling of ions generated in the doping step by means of an ion implantation.

15 Claims, 6 Drawing Sheets

SEMICONDUCTOR DEVICE AND METHOD OF MANUFACTURING THE SAME INCLUDING RAISED SOURCE/DRAIN COMPRISING SIGE OR SIC

CROSS-REFERENCE TO RELATED APPLICATIONS

This application is based upon and claims the benefit of priority from the prior Japanese Patent Applications No. 11-125746, filed May 6, 1999; and No. 2000-130412, filed Apr. 28, 2000, the entire contents of which are incorporated herein by reference.

BACKGROUND OF THE INVENTION

The present invention relates to a MOS type semiconductor device, particularly, to a method of forming source/drain regions and a MOS type semiconductor device obtained by employing this forming method.

In the case of forming diffusion regions forming the source/drain regions in a semiconductor integrated circuit device having a MOS transistor, it is necessary to form shallow the diffusion regions in order to suppress the short channel effect of the transistor. A so-called "elevated source/drain structure", in which silicon is elevated in only the source/drain regions, is known to the art as an effective means for maintaining a low resistance of the diffusion regions.

The general method for achieving the elevated source/drain structure is to selectively grow silicon layers on the source/drain regions by using a selective growth method. For realizing a silicon growth on the silicon substrate while not growing a silicon on the insulating film in the selective silicon growth, it is absolutely necessary to apply a pretreatment of the selective growth to remove sufficiently the native oxide film formed on the silicon layer. As the result, a single crystalline silicon layer is formed on the source/drain regions. Several other methods have also been tried to date.

How to prepare a conventional MOS transistor having an elevated source/drain structure will now be described with reference to FIGS. 14 and 15. FIGS. 14 and 15 are cross sectional views showing a process of manufacturing a MOS transistor. A gate oxide film ($SiO_2$) 102 is formed by, for example, thermal oxidation on the main surface of an n-type silicon semiconductor substrate 101, followed by forming a gate electrode 103 made of, for example, polycrystalline silicon and having a side wall insulating film 104 (FIG. 14A). Then, the gate oxide film 102 positioned outside an area in which the gate oxide film 102 is formed, is removed by etching. Further, the native oxide film formed on the exposed surface of the semiconductor substrate is removed by using an aqueous solution of hydrofluoric acid, followed by selectively performing growth of a silicon single crystalline film 105 in a thickness of about 50 nm on the exposed surface of the semiconductor substrate by using a CVD (Chemical Vapor Deposition) apparatus, (FIG. 14B). At this time, a polycrystalline silicon film 105' is grown on the gate electrode 103. Silane gas, for example, is used for the growth of the silicon single crystalline film 105. Then, a p-type impurity such as boron ($BF_2$) is introduced through the selectively grown silicon single crystalline film 105 by ion implantation under the condition with acceleration energy of 10 keV and at a dose of $5 \times 10^{15} cm^{-2}$ (FIG. 15A). Further, a heat treatment is applied by RTA (Rapid thermal annealing) at 800° C. for 10 seconds for diffusing the implanted impurity so as to form p-type impurity diffusion regions forming a source region 107 and a drain region 108 (FIG. 15B).

As described above, in the elevated source/drain structure, the doping to the source/drain regions is performed by the ion implantation of the dopant after selective growth of a silicon layer in an attempt to form shallow diffusion layers. The thickness of the silicon single crystalline layer is increased by the selective growth so as to achieve a shallow diffusion layer, compared with the case where the selective growth is not carried out. However, since the grown film is single crystalline, the channeling in the ion implantation step is unavoidable. For avoiding the channeling problem, it is desirable to employ a selective growth of polycrystalline silicon. However, it is necessary to remove the native oxide film for the reason as described above, with the result that the grown film tends to become single crystalline. Such being the situation, it was difficult to form a polysilicon film by the selective growth. Incidentally, the selective growing method of polysilicon is described in, for example, Japanese Patent Application No. 3-149127 and "F. Mieno et al Journal of Electrochemical Society vol. 134, p. 2862(1987)". In these prior arts, the deposited silicon film is allowed to contain a high concentration of carbon and oxygen so as to make the deposited silicon layer polycrystalline. As a result, it is unavoidable for the formed polysilicon layer to exhibit a high resistance, giving rise to a problem in using the polysilicon film as a conductive material.

BRIEF SUMMARY OF THE INVENTION

The present invention has been achieved in view of above-mentioned circumstances, and has its object to provide a method of manufacturing a semiconductor device, which-permits suppressing the channeling in the impurity doping step by an ion implantation method for forming the source/drain regions, which permits forming a shallow impurity diffusion region having a low resistance, and which also permits forming a fine MOS transistor advantageous in coping with the short-channel (short) effect.

In the present invention, a SiGe or SiC layer is selectively grown on the source/drain regions, followed by selectively growing a silicon layer. By setting the C or Ge content at a level higher than a predetermined concentration, a single crystal layer having a high dislocation density or a polysilicon layer is allowed to grow in the forming step of the silicon film. In the step of selective growth of a silicon layer, the silicon layer on the source/drain regions is not a single crystal. Even if the silicon layer is a single crystal, the silicon layer has a dislocation density. Therefore, the silicon film formed thereon is a single crystal having a high density of dislocation or a polysilicon. It follows that it is possible to prevent the difficulty caused by the channeling of ions generated in the impurity doping step by ion implantation for forming the source/drain regions. To be more specific, it is possible to prevent the impurity from being diffused to reach a deep region, making it possible to form a shallow impurity diffusion region having a low resistance, compared with the prior art in which a single crystal film prominently low in defects is grown selectively. It should also be noted that, since the diffusion coefficient within the deposited region is higher than that within the semiconductor substrate, it is possible to obtain an impurity diffusion region having a step-profile. As a result, it is possible to form a fine MOS transistor advantageous in terms of the short-channel effect.

A method of manufacturing a semiconductor device according to the present invention comprises the steps of forming a gate insulating film and a gate electrode on a main surface of a silicon semiconductor substrate; selectively depositing on only the exposed region of the main surface of the semiconductor substrate a conductive film containing germanium or a conductive film made of silicon carbide; depositing a silicon film on the conductive film of the region; and forming source/drain regions by implanting and diffusing an impurity into the main surface of the semiconductor substrate through the conductive film and the silicon film deposited on the conductive film with the gate electrode used as a mask. The silicon film deposited on the conductive film may be a polycrystalline film or a monocrystalline film having a dislocation density of at least $10^8 cm^{-2}$. The manufacturing method may further comprise the step of forming extension regions in predetermined regions for forming the source/drain regions, wherein the step is performed after formation of the gate electrode and before deposition of the conductive film containing germanium or conductive film made of silicon carbide. The manufacturing method may further comprise the step of lowering the resistance of the surface of the silicon film deposited on the conductive film. The step of lowering the resistance of the surface of the silicon film deposited on the conductive film may include a step of depositing a metal film on the surface of the deposited silicon film. A $CoSi_2$ film, for example, may be formed on the silicon film surface to lower the resistance. The manufacturing method may further comprise the step of forming a side wall insulating film on the side surface of the gate electrode. The silicon carbide film may have a film thickness of 0.1 to 10 nm. The conductive film containing germanium may contain at least 20 atomic % of germanium. The conductive film containing germanium may contain at least $1\times10^{16}cm^{-2}$ of germanium in terms of areal density. The conductive film made of silicon carbide may contain at least $1\times10^{16}cm^{-2}$ of silicon carbide in terms of areal density.

Furthermore, a method of manufacturing a semiconductor device, according to the present invention comprises the steps of forming a gate insulating film and a gate electrode on a main surface of a silicon semiconductor substrate; selectively carbonizing only the exposed region of the main surface of the semiconductor substrate to selectively form a silicon carbide film on the exposed region, after formation of the gate electrode; depositing a silicon film on the silicon carbide film of the region; and forming source/drain regions by implanting and diffusing an impurity into the main surface of the semiconductor substrate through the silicon carbide film and the silicon film deposited on the silicon carbide film with the gate electrode used as a mask. The manufacturing method may further comprise the step of forming extension regions in predetermined regions for forming the source/drain regions, wherein the step is performed after formation of the silicon carbide film and before deposition of the silicon film on the silicon carbide film. The manufacturing method may further comprise the step of lowering the resistance of the surface of the deposited silicon film. The step of lowering the resistance of the surface of the deposited silicon film may include a step of depositing a metal film on the surface of the deposited silicon film. The manufacturing method may further comprise the step of forming a side wall insulating film on the side surface of the gate electrode. The silicon carbide film may have a film thickness of 0.1 to 10 nm.

Also, a semiconductor device according to the present invention comprises a silicon semiconductor substrate; a gate insulating film and a gate electrode formed on a main surface of the semiconductor substrate; a conductive film containing germanium or a conductive film made of silicon carbide, the conductive film being formed on a silicon-exposed region on the main surface of the semiconductor substrate; a silicon film formed on the conductive film on the region; and source/drain regions formed in the silicon semiconductor substrate region below the silicon film and the conductive film, wherein the silicon film is a polycrystalline film or a monocrystalline film having a dislocation density of at least $10^8 cm^{-2}$. The silicon film deposited on the conductive film may be a polycrystalline film or a monocrystalline film having a dislocation density of at least $10^8 cm^{-2}$. The conductive film containing germanium may contain at least 20 atomic % of germanium. The conductive film containing germanium may contain at least $1\times10^{16}cm^{-2}$ of germanium in terms of areal density. The silicon carbide film may have a film thickness of 0.1 to 10 nm.

The regions on which the conductive films are selectively deposited and the surface of the silicon substrate of which is partially exposed include the source/drain regions of a MOS transistor. In the source/drain regions of the MOS transistor, the distribution in a depth direction of a specified component such as germanium or carbon has a maximum value. The depth exhibiting the maximum value is in the vicinity of the gate insulator film. The dislocation density in a region shallower than the depth exhibiting the maximum value is higher than that in a region deeper than the depth exhibiting the maximum value. It is possible for the crystallinity in a region shallower than the depth exhibiting the maximum value to be polycrystalline. The diffusion coefficient of the dopant added to the source/drain regions is higher in a region shallower than the depth exhibiting the maximum value than in a region deeper than the depth exhibiting the maximum value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

Figure 3:
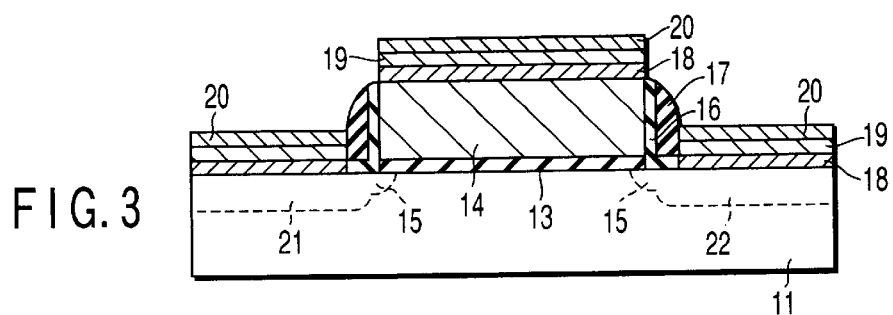
FIG. 3 is a cross sectional view showing the semiconductor device in a manufacturing step according to the first embodiment of the present invention.
Figure 4A:
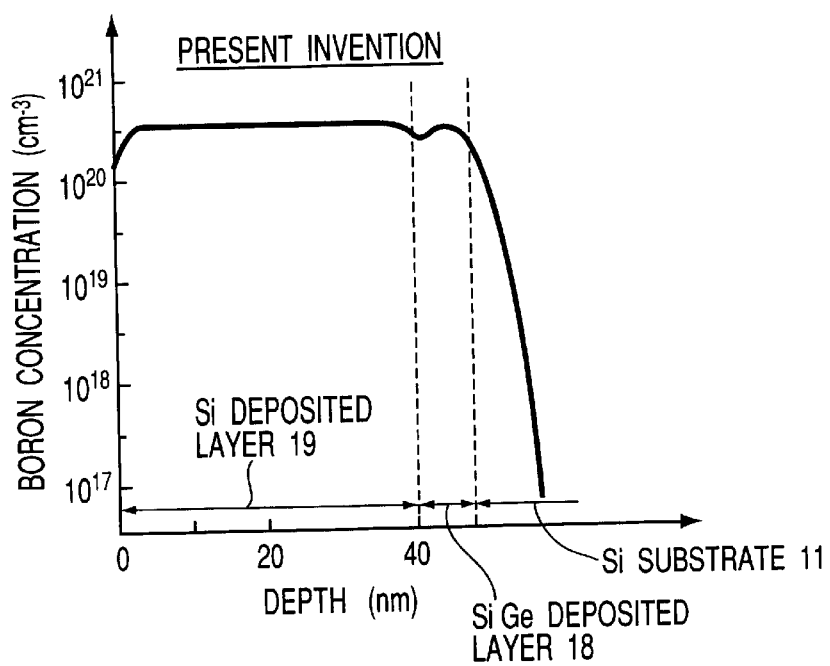
FIGS. 4A and 4B are graphs showing a dopant profile in a semiconductor substrate including the source/drain regions for the present invention (a) and showing a dopant profile in a semiconductor substrate including the source/drain regions for the prior art (b), respective.
Figure 4B:
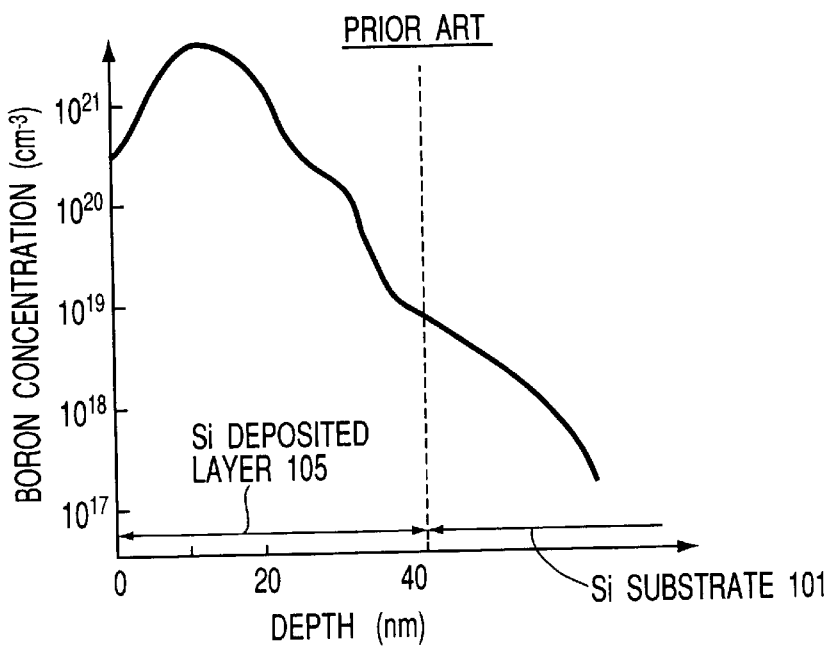
Figure 5:
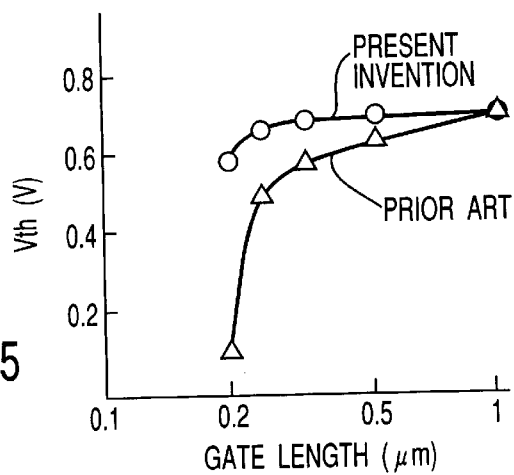
FIG. 5 is a characteristic graph showing the relationship between the threshold voltage (Vth) and the gate length in respect of the MOS transistor of the present invention and the conventional MOS transistor.
Figure 6:
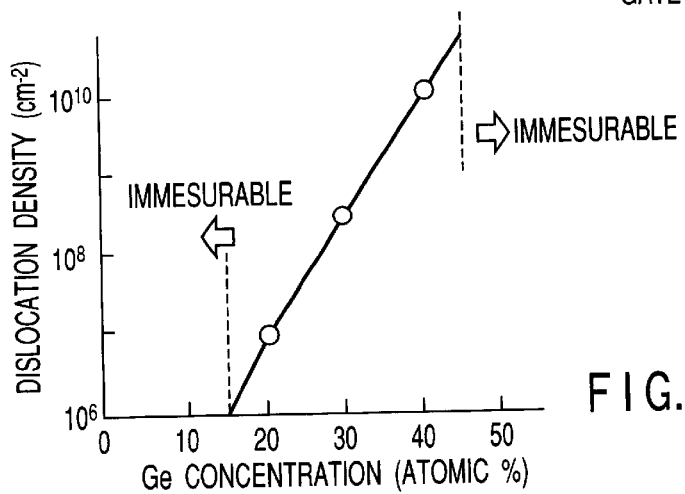
FIG. 6 is a characteristic graph showing the relationship between the dislocation density in the silicon film and the germanium concentration in the silicon-germanium film.
Figure 7:
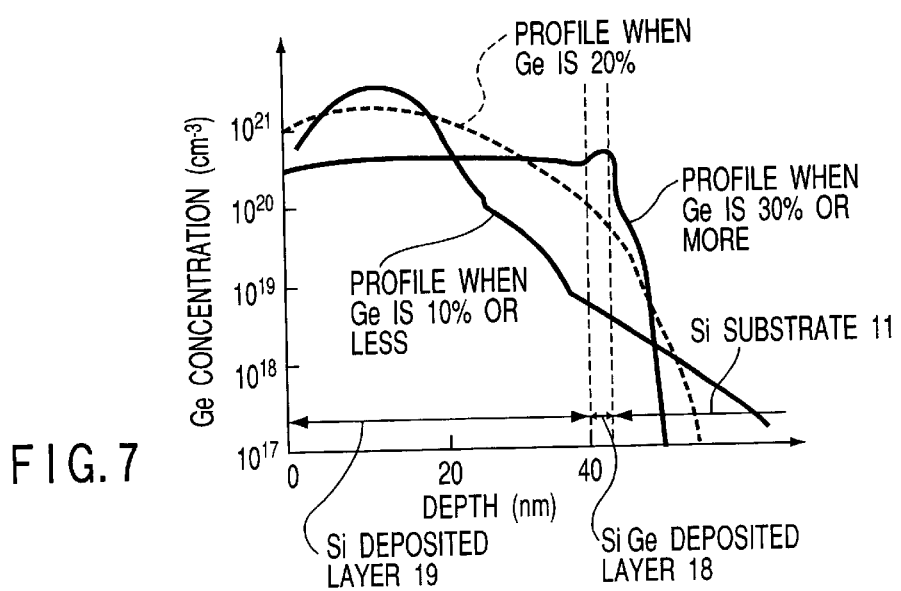
FIG. 7 shows the dopant profiles in the semiconductor subs ate including the source/drain regions.

A first embodiment of the present invention will now be described with reference to FIGS. 1A to 7. In this embodiment, the present invention is applied to a MOS transistor. FIGS. 1A to 3 are cross sectional views showing a semiconductor device in the manufacturing steps, FIGS. 4A and 4B are graphs showing dopant profiles in the depth direction of semiconductor substrates for the present invention and a prior art, respectively, i.e., in the depth direction of a region covered with silicon film and a silicon-germanium film including the source/drain regions, FIG. 5 is a graph showing the relationship between the threshold voltage (Vth) and the gate length in respect of the MOS transistor, FIG. 6 is a graph showing the relationship between the dislocation density in the silicon film and the germanium concentration (atomic %) in the silicon-germanium film, and FIG. 7 shows the dopant profiles in the semiconductor substrate, i.e., in the depth direction of a region covered with silicon film and a silicon-germanium film including the source/drain regions.

A method of manufacturing a MOS transistor according to this embodiment will now be described.

Figure 1A:
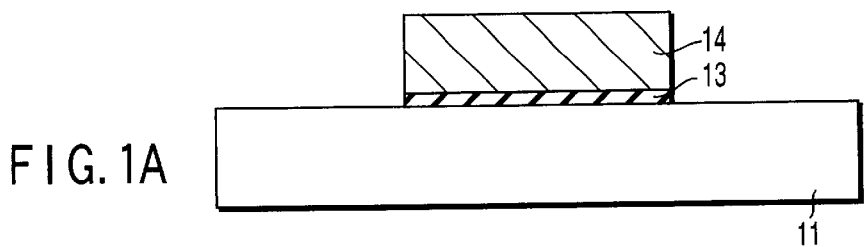
FIGS. 1A and 1B are cross sectional views showing a semiconductor devices in manufacturing steps according to a first embodiment of the present invention, respectively.

An element separating insulating film (not shown) is formed on an N-type single crystalline silicon semiconductor substrate 11 having (100) orientation for partitioning the element regions, followed by forming successively a gate oxide film ($SiO_2$) and an undoped polysilicon film having a thickness of 60 nm by the known semiconductor manufacturing technology. Then, the gate insulating oxide film and the polysilicon film is patterned by a reactive ion etching (RIE: Reactive Ion Etching) to form a gate oxide film ($SiO_2$) 13 and a gate electrode 14 in the element region (FIG. 1A).

Figure 1B:
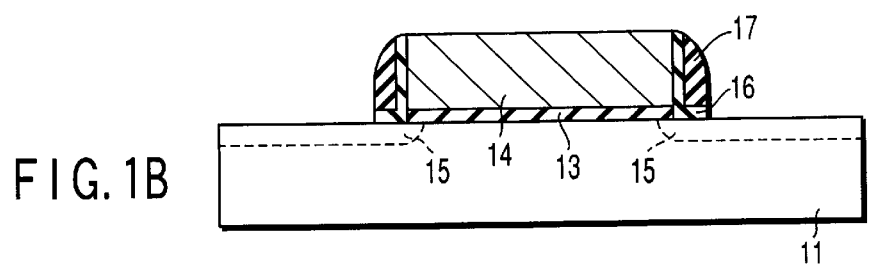

After that, $BF_2$ is introduced for forming an extension region by means of ion implantation with an accelerating energy of 5 keV and at a dose of $1 \times 10^{14} cm^{-2}$, using the gate electrode 14 as a mask, followed by applying RTA (Rapid Thermal Annealing) at 800° C. for 10 seconds so as to form p-type impurity diffusion regions forming the extension regions 15 in a thickness of about 0.1 μm in the surface of the semiconductor substrate 11. The depth of the extension region should desirably be about 30 to 50 nm. Then, a silicon oxide ($SiO_2$) film is formed in a thickness of about 20 nm by a CVD method, followed by forming a silicon nitride ($Si_3N_4$) film in a thickness of 50 nm on the silicon oxide film by a CVD method,-followed by applying an RIE etching to form a side wall insulating film consisting of the silicon oxide ($SiO_2$) film 16 and the silicon nitride ($Si_3N_4$) film 17 on the side wall of the gate electrode 14. Further, the native oxide film on the source/drain forming regions and the gate electrode are removed by treatment with, for example, hydrofluoric acid (FIG. 1B).

Figure 2A:
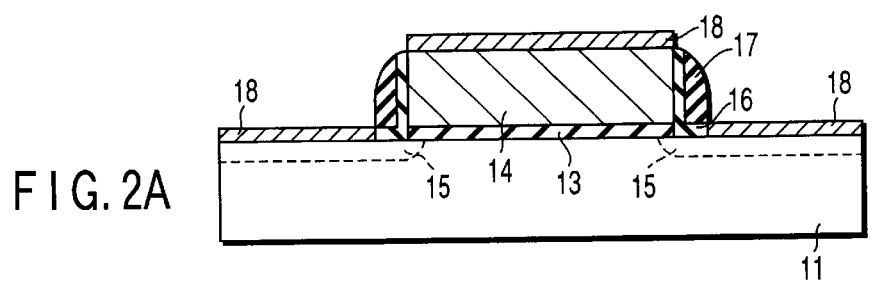
FIGS. 2A and 2B are cross sectional views showing the semiconductor device in manufacturing steps according to the first embodiment of the present invention, respectively.

Then, an undoped silicon-germanium film 18 is selectively deposited in a thickness of 10 nm on the regions for forming source/drain diffusion regions and on the gate electrode by a reduced pressure CVD method using dichlorosilane/monogermane as a source gas (FIG. 2A). The selective growth is performed under the pressure of 2 Torr and a temperature of 750° C. by using a mixed gas consisting of dichlorosilane and monogermane mixed at a flow rate ratio of 10:1 as a source gas and a hydrogen gas as a carrier gas. The silicon-germanium film deposited in this step was found to consist of 80% of silicon and 20% of germanium. Also, dislocation was observed at a high density in the film deposited on the regions for forming the source/drain regions.

The thickness of the silicon-germanium film should be controlled to fall within a range of between 10 nm and 100 nm. If the thickness is not larger than 10 nm, the silicon film formed on the silicon-germanium film tends to form a single crystal having a very small number of defects. If the thickness exceeds 100 nm, however, the resistance is rendered excessively high. It is particularly desirable to control the thickness of the silicon-germanium film to fall within a range of between 30 nm and 50 nm.

Figure 2B:
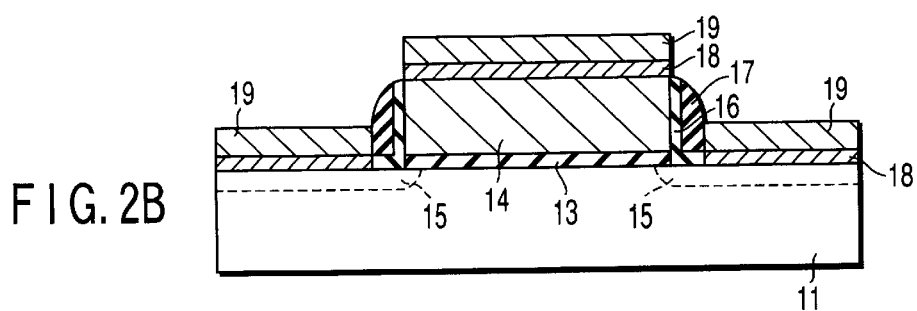

In the next step, an undoped silicon film 19 in the thickness of 40 nm is selectively deposited on the silicon-germanium film 18. Dislocations are observed at a high density in the undoped silicon film 19, too, as in the underlying silicon-germanium film 18, supporting that the undoped silicon film 19 is polycrystalline. The selective growth was carried out under a pressure of 50 Torr and a temperature of 850° C. while supplying a mixed gas consisting of dichlorosilane, hydrogen and hydrogen chloride (FIG. 2B). It is desirable for the silicon film to have a thickness not larger than 40 nm, particularly, not larger than 20 nm. In this embodiment, the total thickness of the conductive film 18 and the silicon film 19 is set at 50 nm.

Then, $BF_2$ ions are implanted under an accelerating energy of 10 keV and at a dose of $5 \times 10^{15} cm^{-2}$, followed by applying an RTA at 800° C. for 10 seconds so as to form a source region 21, a drain region 22. In this step, the gate electrode 14 is also doped with the impurity. Further, a Co film is deposited in a thickness of 20 nm on the entire surface of the semiconductor substrate 11 by a sputtering method, followed by depositing a TiN film on the Co film in a thickness of 30 nm. After that, the semiconductor substrate 11 is subjected to a heat treatment at 500° C. for 30 seconds. As a result, the Co film in contact with the silicon film 19 reacts with the silicon film 19 to form a CoSi film. After that, the TiN film and the unreacted Co film are removed, followed by applying a heat treatment at 700° C. for 30 seconds so as to selectively form CoSi$_2$ film 20 only on the source/drain regions and the gate electrode 14 (FIG. 3).

In this embodiment, since the silicon-germanium film is formed on the lower interface of the metal silicide, then the metal silicide is suppressed to move when an annealing is carried out after the metal silicide is formed. As a result, an agglomeration of the metal silicide is suppressed and the film thickness of the metal silicide is formed uniform. Thus, the resistance of the diffusion layer is suppressed to increase and the variance of the resistance is reduced, thus providing a low resistance diffusion layer and a low contact resistance.

The MOS transistor structure formed in this embodiment was compared with the conventional MOS transistor in which the silicon-germanium film was not formed and the silicon single crystalline film was formed in a thickness of 50 nm. It has been confirmed that the MOS transistor of the present invention is effective for improving the short channel characteristics, as shown in FIG. 5. In FIG. 5, the threshold value (Vth) (V) of the transistor is plotted on the ordinate, with the gate length (μm) of the transistor being plotted on the abscissa. The threshold value (Vth) is markedly lowered in the conventional MOS transistor in the case where the gate length is 0.2 μm. It is considered reasonable to interpret the data to the effect that the silicon film is made polycrystalline in the present invention so as to suppress the channeling and to form a shallow impurity diffusion region in spite of the fact that the BF$_2$ ions were implanted under the same accelerating energy in the conventional example and the present embodiment. The parasitic resistance was also examined, finding that the resistance was made lower in the present invention. As a matter of fact, the dopant profiles of these samples were examined by SIMS (Secondary Ion Mass Spectrtoscopy), finding that the channeling was suppressed to obtain a shallower junction depth as shown in FIG. 4A (present invention), as compared with the conventional example as shown in FIG. 4B. The short channel effect was suppressed because it was possible to make the depth of the tail portion of boron (B) shallower in the profile. Also, comparison of the dopant concentrations in the surface region shows that the dopant concentration in the present invention is uniform, as shown in FIG. 4A. It should be noted in this connection that the silicon film 19 consists of crystals containing a large number of dislocations, leading to a large diffusion coefficient within the substrate. As a result, the implanted boron ions do not remain in the peak depth in the implanting step and, thus, the amount of the active boron is increased so as to lower the resistance of the impurity diffusion region.

The embodiment described above is directed to a p-channel transistor using boron as a dopant. However, similar effects were also confirmed in the case of an n-channel transistor using phosphorus (P) or arsenic (As) as a dopant. Where the technical idea of the present invention is applied to a semiconductor device of a CMOS structure in which a p-channel transistor and an n-channel transistor are formed on a single semiconductor substrate, boron is used as a p-type impurity and phosphorus or arsenic is used as an n-type impurity. In the case of forming source/drain regions of a p-channel transistor, boron ions are implanted into the p-channel transistor region with the n-channel transistor region covered with photoresist. Also, in the case of forming source/drain regions of an n-channel transistor, phosphorus or arsenic ions are implanted into the n-channel transistor region with the p-channel transistor region covered with photoresist. In the above embodiment, a single crystal silicon semiconductor substrate having (100) orientation is used. However, a single crystal silicon semiconductor substrate having (110) or (111) orientation may be used.

In the embodiment described above, the silicon-germanium film contained 20% of germanium. The dependencies on the Ge concentration were examined. In these experiments, SiGe films were formed with the Ge content varied stepwise between 0% and 100%. Specifically, a laminate structure consisting of a SiGe film having a thickness of 10 nm and a silicon film having a thickness of 40 nm was formed, followed by implanting boron ions into the silicon film so as to examine the crystallinity of the silicon film and the boron profile after annealing of the implanted dopant (boron). FIG. 6 is a graph showing the relationship between the Ge concentration and the dislocation density. Also, FIG. 7 shows the difference of the dopant (boron) profiles relative to the Ge concentration.

In the graph of FIG. 6, the dislocation density (cm$^{-2}$) of the silicon film 19 is plotted on the ordinate. Also, the Ge concentration (atomic %) of the silicon-germanium (SiGe) film 18 is plotted on the abscissa. On the other hand, in the graph of FIG. 7, the dopant (boron) concentration (cm$^{-3}$) of the semiconductor substrate 11, the silicon-germanium film 18, and the silicon film 19 is plotted on the ordinate, with the depth (nm) in the direction of the semiconductor substrate 11 from the surface of the silicon film 19 being plotted on the abscissa. As apparent from FIG. 6, the dislocation density is too low to measure and lower than the measurable limit when the Ge concentration is below than 15% and, when the Ge concentration exceeds 15%, the dislocation density starts to increase. When the Ge concentration exceeds 45%, a polycrystalline structure is formed to make it impossible to observe the dislocation density. The experimental data well conforms with FIG. 7, supporting that, if the Ge concentration exceeds 20%, the diffusion layer can be formed shallow. These experimental data support that the effect of the present invention, i.e., the dopant profile control, can be produced by forming a silicon-germanium film 18 having at least 20% of the Ge concentration. In these experiments, the silicon-germanium film 18 was formed in a thickness of 10 nm. However, the silicon-germanium film may be thinner or thicker than 10 nm. In the experiment in which the silicon-germanium film was formed in a thickness smaller than 10 nm, it has been confirmed that it suffices for the Ge concentration to have an areal density of at least $10^{16}$cm$^{-2}$.

In the embodiment described above, a silicon-germanium film 18 was deposited first, followed by depositing a silicon film 19. Alternatively, it is possible to deposit a silicon film, followed by depositing a silicon-germanium film in the silicon film and subsequently forming another silicon film on the silicon-germanium film. In this case, it is possible to change freely the position at which the dopant concentration is greatly changed after the heat treatment. Also, in the embodiment described above, each of the silicon-germanium film 18 and the silicon film 19 was deposited in an undoped state. However, it is also possible to supply gas containing dopant atoms such as P, B or As together with the source gas in the depositing process so that the depositing is carried out together with doping.

Further, in the embodiment described above, the source/drain regions of the MOS transistor was made non-monocrystalline. However, it is also possible to deposit a non-monocrystalline film selectively on the region in which the silicon film is exposed to the surface so as to utilize the non-monocrystalline film as a conductive material.

A second embodiment of the present invention will now be described with reference to FIGS. 8A to 10.

Specifically, FIGS. 8A to 10 are cross sectional views showing a semiconductor device in the manufacturing steps. In this embodiment, similarly to the first embodiment, the present invention is applied to a MOS transistor. In this embodiment, an undoped silicon carbide (SiC) film 23 is deposited in place of depositing the undoped silicon-germanium film 18 in the first embodiment. Only this feature differs from the first embodiment, and the other portions or parts are essentially the same.

A method of manufacturing a MOS transistor according to this embodiment will now be described.

Figure 8A:
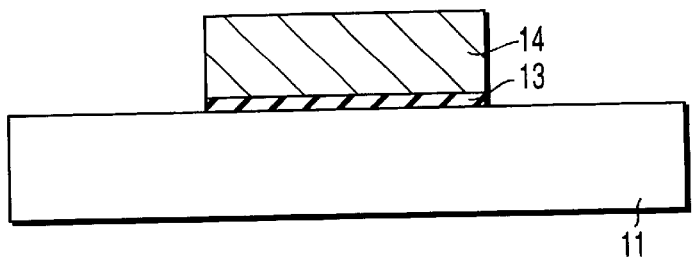
FIGS. 8A and 8B are cross sectional views showing a semiconductor device in manufacturing steps according to a second embodiment of the present invention, respectively.

An element separating insulating film (not shown) is formed on an N-type single crystalline silicon semiconductor substrate 11 having (100) orientation for partitioning the element regions, followed by forming successively a gate oxide film ($SiO_2$) and an undoped polysilicon film having a thickness of 60 nm by the known semiconductor manufacturing technology. Then, the gate insulating oxide film and the polysilicon film are patterned by a reactive ion etching (RIE: Reactive Ion Etching) to form a gate oxide film ($SiO_2$) 13 and a gate electrode 14 in the device region (FIG. 8A).

Figure 8B:
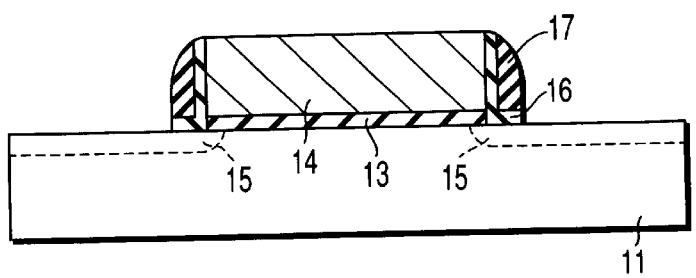

After that, $BF_2$ is introduced for forming an extension region by means of ion implantation under an accelerating energy of 5 keV and at a dose of $1 \times 10^{14} cm^{-2}$, using the gate electrode 14 as a mask, followed by applying RTA (Rapid Thermal Annealing) at 800° C. for 10 seconds so as to form p-type impurity diffusion regions forming the extension (Extension) regions 15 in a thickness of about 0.1 $\mu$m in the surface of the semiconductor substrate 11. The depth of the extension region should desirably be about 30 to 50 nm. Then, a silicon oxide ($SiO_2$) film is formed in a thickness of about 20 nm, followed by forming a silicon nitride ($Si_3N_4$) film in a thickness of 50 nm on the silicon oxide film, followed by applying an RIE etching to form a side wall insulating film consisting of the silicon oxide ($SiO_2$) film 16 and the silicon nitride ($Si_3N_4$) film 17 on the side wall of the gate electrode 14. Further, the native oxide film on the extension region 15 and the gate electrode 14 are removed by treatment with, for example, hydrofluoric acid (FIG. 8B).

Figure 9A:
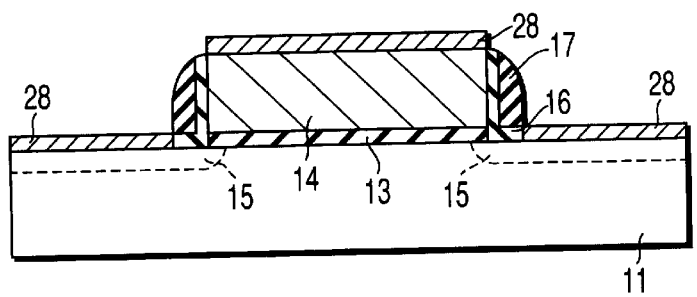
FIGS. 9A and 9B are cross sectional views showing the semiconductor device manufacturing steps according to the second embodiment of the present invention, respectively.

Then, an undoped silicon carbide (SiC) film 28 in the thickness of 10 nm is selectively deposited only on the silicon-exposed portion, i.e., the extension region 15 and the gate electrode 14, by using a mixed gas consisting of dichlorosilane ($SiH_2Cl_2$) and dimethyl silane ($C_2H_8Si$). The silicon carbide film 28 deposited in this step consists of 50 atomic % of silicon and 50 atomic % of carbon. It was observed that the silicon carbide film 28 was polycrystalline and amorphous on the extension region 15 (FIG. 9A).

Figure 9B:
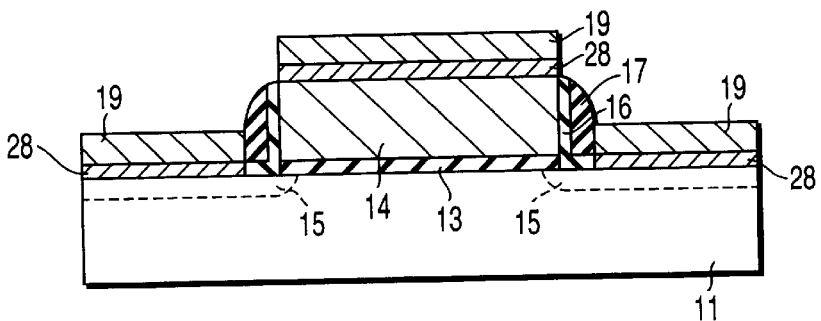

In the next step, an undoped silicon film 19 in the thickness of 40 nm is selectively deposited on the undoped silicon-carbide film 18, using only dichlorosilane as a source gas. The crystallity of the undoped silicon film was polycrystalline, which is due to the fact that the silicon film cannot epitaxially grow on the undoped silicon carbide film 28 underlying the silicon film. The selective growth was carried out under a pressure of 50 Torr and a temperature of 850° C. while supplying a mixed gas consisting of dichlorosilane, hydrogen and hydrogen chloride. It is desirable for the silicon film to have a thickness not larger than 40 nm, particularly, not larger than 20 nm. In this embodiment, the total thickness of the undoped silicon carbide film 28 and the silicon film 19 is set at 50 nm (FIG. 9B).

Figure 10:
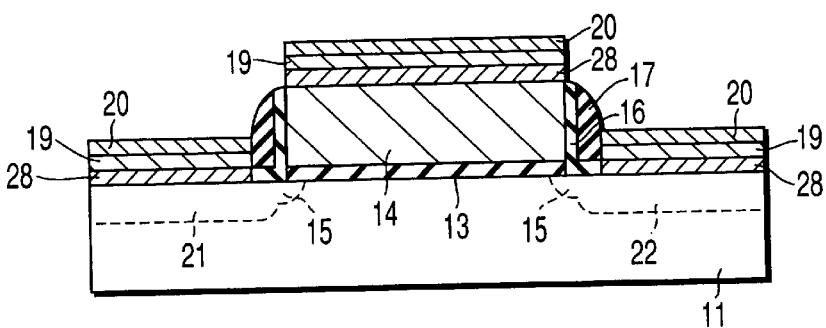
FIG. 10 is a cross sectional view showing the semiconductor device in a manufacturing step according to the second embodiment of the present invention.

Then, $BF_2$ ions are implanted under an accelerating energy of 10 keV and at a dose of $5 \times 10^{15} cm^{-2}$, followed by applying an RTA at 800° C. for 10 seconds so as to form a source region 21, a drain region 22. In this step, the gate electrode 14 is also doped with the impurity. Further, a Co film is deposited in a thickness of 20 nm on the entire surface of the semiconductor substrate 11 by a sputtering method, followed by depositing a TiN film on the Co film in a thickness of 30 nm. After that, the semiconductor substrate 11 is subjected to a heat treatment at 500° C. for 30 seconds. As a result, the Co film in contact with the silicon film 19 reacts with the silicon film 19 to form a CoSi film. After that, the TiN film and the unreacted Co film are removed, followed by applying a heat treatment at 700° C. for 30 seconds so as to selectively form $CoSi_2$ film 20 only on the source/drain regions and the gate electrode 14 (FIG. 10).

The thickness of the silicon-carbide film should be controlled to fall within a range of between 10 nm and 100 nm. If the thickness is not larger than 10 nm, the silicon film formed on the silicon-carbide film tends to form a single crystal having a very small number of defects. If the thickness exceeds 100 nm, however, the resistance is rendered excessively high. It is particularly desirable to control the thickness of the silicon-carbide film to fall within a range of between 30 nm and 50 nm.

In this embodiment, an undoped silicon carbide (SiC) film 28 is deposited in place of depositing the undoped silicon-germanium film 18 in the first embodiment. However, since the undoped silicon carbide film is formed on the lower interface of the metal silicide, then the metal silicide is suppressed to move when an annealing is carried out after the metal silicide is formed. As a result, an agglomeration of the metal silicide is suppressed and the film thickness of the metal silicide is formed uniform. Thus, the resistance of the diffusion layer is suppressed to increase and the variance of the resistance is reduced, thus providing a low resistance diffusion layer and a low contact resistance.

The dopant profile was observed in this structure, finding that the shape of an impurity diffusion region having a stepped profile as shown in FIG. 7 was obtained so as to support the similar effects.

The silicon carbide (SiC) film 28 may be formed by coating an organic material, typically pentadecane (pentadecane) ($C_{15}H_{32}$), and annealing the organic material.

A third embodiment of the present invention will now be described with reference to FIGS. 11A to 13. In this embodiment, similarly to the first and second embodiments, the present invention is applied to a MOS transistor. Specifically, FIGS. 11A to 13 are cross sectional views showing a semiconductor device in the manufacturing steps.

A method of manufacturing a MOS transistor according to this embodiment will now be described.

Figure 11A:
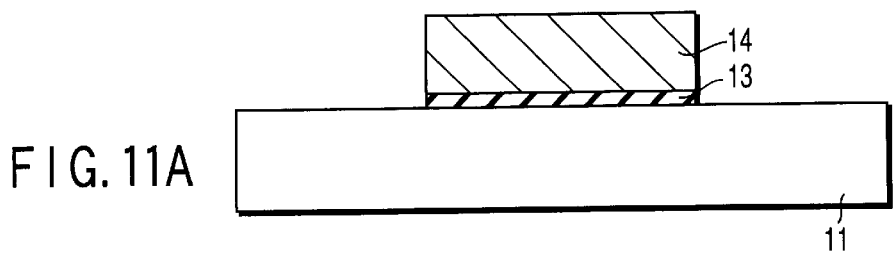
FIGS. 11A and 11B are cross sectional views showing a conductor in manufacturing steps according to a third embodiment of the present invention, respectively.
Figure 11B:
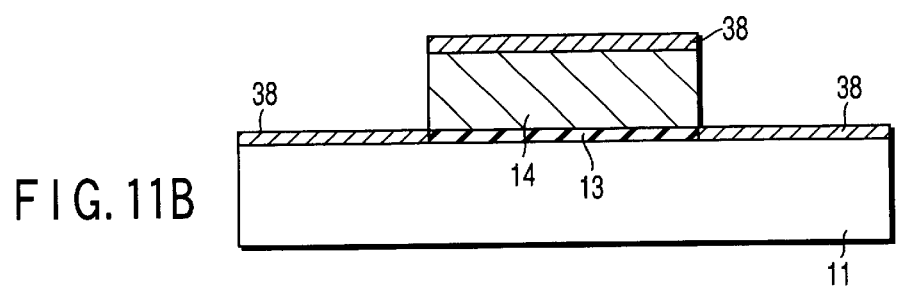

An element separating insulating film (not shown) is formed on an N-type crystalline silicon semiconductor substrate 11 having (100) orientation for partitioning the element regions, followed by forming successively a gate insulating oxide film ($SiO_2$) and an undoped polysilicon film having a thickness of 60 nm by the known semiconductor manufacturing technology. Then, the gate insulating oxide film and the polysilicon film is patterned by a reactive ion etching to form a gate oxide film ($SiO_2$) 13 and a gate electrode 14 in the element region (FIG. 11A).

Then, a treatment with dilute hydrofluoric acid is carried out, followed by selectively carbonizing only the source/drain regions and the gate electrode of the semiconductor substrate 11 to form a silicon carbide film 38 in the thickness of 1 nm on each of the source/drain regions and the gate electrode, under a temperature of 880° C. and a pressure of 0.5 Torr by a reduced pressure CVD method, using $C_2H_4$.

The semiconductor substrate 11 is carried into a CVD chamber (not shown) in which the silicon carbide film 38 is formed. It is preferable that carrying the substrate into the CVD chamber is performed in an $N_2$ atmosphere to suppress the formation of a native oxide film. It is also preferable that before carbonization, hydrogen is supplied into the CVD chamber under the condition of 900° C., 0.2 Torr, 30 min, and 3 sLm to remove the native oxide film. The thickness of the silicon carbide film 38 may be controlled to fall within a range of between 0.1 nm and 10 nm. The thickness of the silicon carbide film can also be determined in terms of areal density of the carbon of the interface, and it has been confirmed that it suffices for the areal density of the carbon to be at least $1\times10^{16} cm^{-2}$ (FIG. 1B).

Figure 12A:
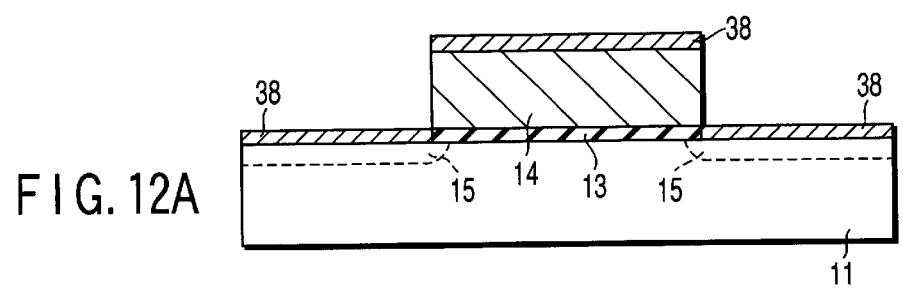
FIGS. 12A and 12B are cross sectional views showing the semiconductor device in manufacturing steps according to the third embodiment of the present invention, respectively.

After that, $BF_2$ is introduced for forming an extension region by means of ion implantation under an accelerating energy of 5 keV and at a dose of 1E14 $cm^{-2}$, using the gate electrode 14 as a mask, followed by applying RTA at 800° C. for 10 seconds so as to form p-type impurity diffusion regions forming the extension regions 15 in the surface of the semiconductor substrate 11. The depth of the extension region 15 should desirably be about 30 to 50 nm (FIG. 12A).

Figure 12B:
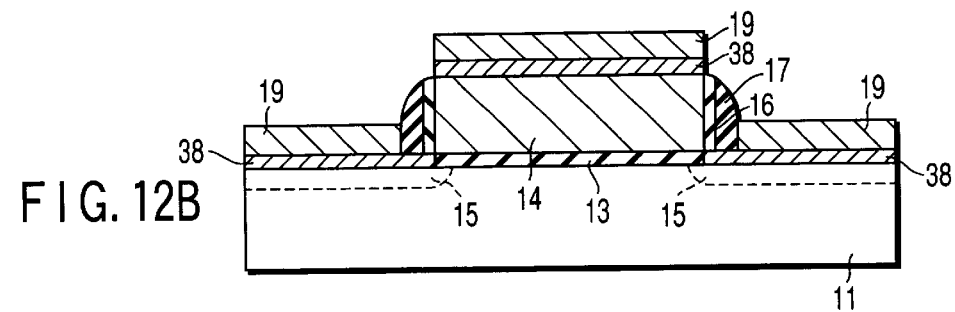

Then, a silicon oxide ($SiO_2$) film is formed in a thickness of about 20 nm, followed by forming a silicon nitride ($Si_3N_4$) film in a thickness of 50 nm on the silicon oxide film, followed by applying an RIE etching to form a side wall insulating film consisting of the silicon oxide ($SiO_2$) film 16 and the silicon nitride ($Si_3N_4$) film 17 on the side wall of the gate electrode 14. Further, the native oxide film on the surface of the silicon carbide film 18 is removed by treatment with dilute hydrofluoric acid, followed by forming an undoped silicon film 19 in the film thickness of 5 nm on the silicon carbide film 38 by selective deposition. The selective growth was carried out under a pressure of 50 Torr and a temperature of 850° C., by a reduced pressure CVD method, using a mixed gas consisting of dichlorosilane, hydrogen and hydrogen chloride (FIG. 12B).

Figure 13:
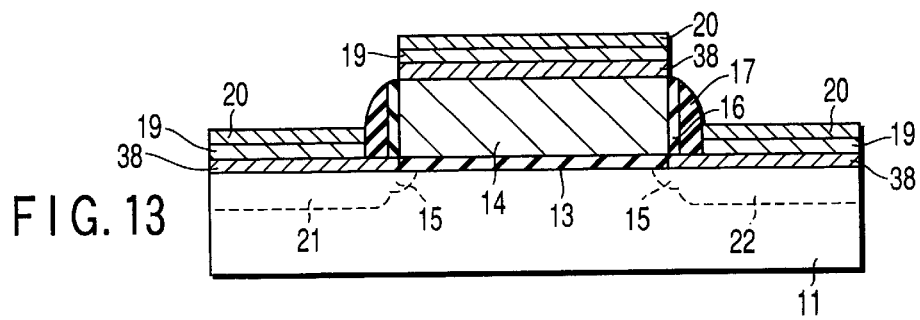
FIG. 13 is a cross sectional view showing the semiconductor device in manufacturing step according to the third embodiment of the present invention.
Figure 14A:
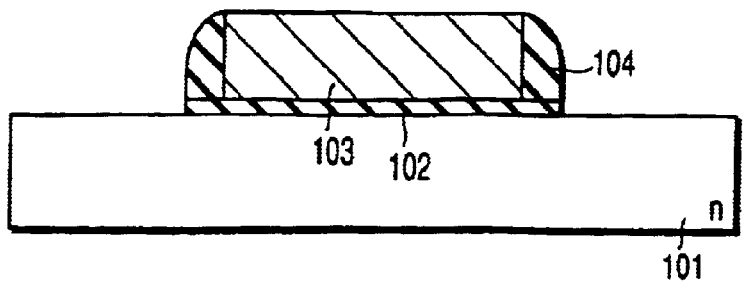
FIGS. 14 and 14B are cross sectional views showing inventional semiconductor device in the manufacturing steps, respectively.
Figure 14B:
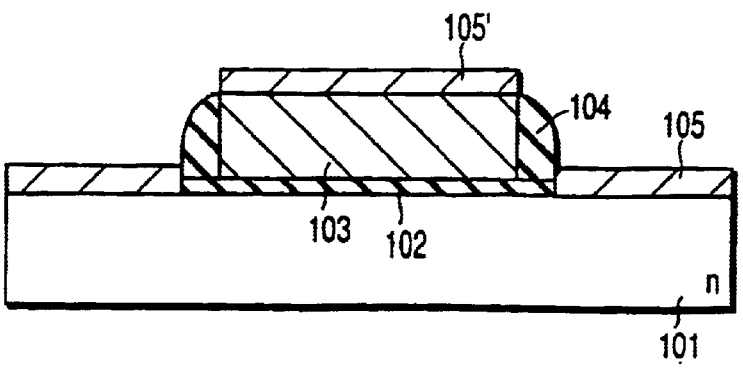
Figure 15A:
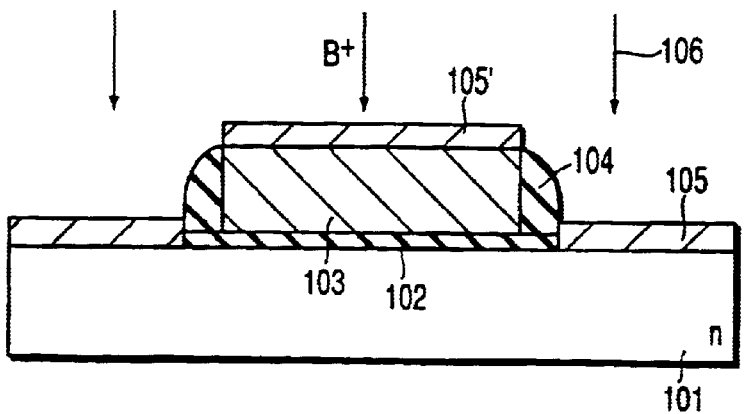
FIGS. 15A and 15B are cross sectional views showing the conventional semiconductor device in the manufacturing steps, respectively.
Figure 15B:
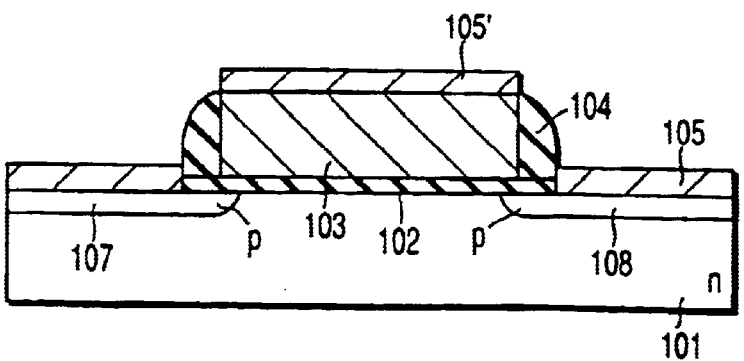

Then, $BF_2$ ions are implanted under an accelerating energy of 10 keV and at a dose of $5\times10^{15} cm^{-2}$, followed by applying an RTA at 800° C. for 10 seconds so as to form a source region 21, a drain region 22. In this step, the gate electrode 14 is also doped with the impurity. Further, a Co film is deposited in a thickness of 20 nm by a sputtering method, followed by depositing a TiN film on the Co film in a thickness of 30 nm. After that, the semiconductor substrate 11 is subjected to a heat treatment at 500° C. for 30 seconds. As a result, the Co film 23 in contact with the silicon film 19 reacts with the silicon film 19 to form a CoSi film 20. After that, the TiN film 24 and the unreacted Co film 23 are removed, followed by applying a heat treatment at 700° C. for 30 seconds so as to change the silicon film 19 selectively formed on each of the source region 21, the drain region 22 and the gate electrode 14 to $CoSi_2$ film 20 (FIG. 13).

In this embodiment, similarly to the second embodiment, since the undoped silicon carbide film is formed on the lower interface of the metal silicide, then the metal silicide is suppressed to move when an annealing is carried out after the metal silicide is formed. As a result, an agglomeration of the metal silibide is suppressed and the film thickness of the metal silicide is formed uniform. Thus, the resistance of the diffusion layer is suppressed to increase and the variance of the resistance is reduced, thus providing a low resistance diffusion layer and a low contact resistance.

The merits pointed out below can be obtained by forming a MOS transistor in which a monocrystalline silicon film having a high density of defects or a polysilicon film is formed on the source/drain regions as in the embodiments described above.

The operating life of the MOS transistor of the present invention was examined under a high temperature condition, by a high voltage application test, finding that the MOS transistor of the present invention exhibits an operating life about 100 times as long as the transistor of the construction that a monocrystalline silicon film low in defect density was formed on the source/drain regions. The monocrystalline silicon film used for the comparison has the defect density lower than $10^8 cm^{-2}$ The fact that such a long operation time could be obtained showed that the silicon film deposited on the conductive film on the source/drain regions was effectively advantageous to the operation of the MOS transistor, provided that the silicon film was a polysilicon film or a single crystal silicon film having a dislocation density lower than $10^8 cm^{-2}$ The reasons for causing the defective portion were examined to be as follows. Some of the grains in the silicide film formed on the source/drain regions grow abnormally large to reach the PN junction positioned right below thereof. Defectiveness is also caused by the similar abnormality in the structure of the present invention in which the particular region is monocrystalline. However, the time leading to the defectiveness was about 100 times as long as in the prior art. The mechanism of bringing about the different time required for the abnormal growth of silicide grains is considered to be as follows. If the region in contact with the silicide film is monocrystalline as in the prior art, and if crystal grains that are to grow abnormally large appear in that region, the particular crystal grains alone grow large to reach the PN junction region. On the other hand, where the region in contact with the silicide film is polycrystalline, an abnormal growth certainly takes place as in the case where a monocrystalline region is in contact with the silicide film. However, since the density of the abnormal growth is increased, the number of the grains which grow to a large grains is low, leading to a low frequency in which the grain is caused to grow to deteriorate the junction characteristics.

As described above, the particular construction of the present invention makes it possible to suppress the channeling in the doping step for forming the source/drain regions by an ion implantation method. As a result, it is possible to form shallow the impurity diffusion region of a low resistance, compared with the prior art in which a monocrystalline film low in defects grows selectively. Also, in the present invention, the diffusion coefficient within the deposited region is higher than that within the semiconductor substrate, making it possible to obtain an impurity diffusion region having a stepped profile. As a result, it is possible to obtain a fine MOS transistor advantageous in coping with the short channel effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a gate insulating film and a gate electrode on a main surface of a silicon semiconductor substrate;
   selectively depositing on only the exposed region of the main surface of the semiconductor substrate a conductive film containing germanium or a conductive film made of silicon carbide;

epositing a silicon film on said conductive film of said region; and forming source/drain regions by implanting and diffusing an impurity into the main surface of said semiconductor substrate through said conductive film and said silicon film deposited on the conductive film with the gate electrode used as a mask, wherein said silicon film deposited on said conductive film is a single crystalline film having a dislocation density of at least $10^8 cm^{-2}$.

2. The method of manufacturing a semiconductor device according to claim 1, further comprising the step of forming extension regions in predetermined regions for forming said source/drain regions, said step being performed after formation of said gate electrode and before deposition of said conductive film containing germanium or conductive film made of silicon carbide.

3. The method of manufacturing a semiconductor device according to claim 1, further comprising the step of lowering the resistance of the surface of said silicon film deposited on the conductive film.

4. The method of manufacturing a semiconductor device according to claim 3, wherein the step of lowering the resistance of the surface of said silicon film deposited on the conductive film includes a step of depositing a metal film on the surface of the deposited silicon film.

5. The method of manufacturing a semiconductor device according to claim 1, further comprising the step of forming a side wall insulating film on the side surface of said gate electrode.

6. The method of manufacturing a semiconductor device according to claim 1, wherein said silicon carbide film has a film thickness of 0.1 to 10 nm.

7. The method of manufacturing a semiconductor device according to claim 1, wherein said conductive film containing germanium contains at least 20 atomic % of germanium.

8. The method of manufacturing a semiconductor device according to claim 1, wherein said conductive film containing germanium contains at least $1 \times 10^{16} cm^{-2}$ of germanium in terms of areal density.

9. The method of manufacturing a semiconductor device according to claim 1, wherein said conductive film made of silicon carbide contains at least $1 \times 10^{16} cm^{-2}$ of silicon carbide in terms of areal density.

10. A method of manufacturing a semiconductor device, comprising the steps of:

forming a gate insulating film and a gate electrode on a main surface of a silicon semiconductor substrate;

selectively carbonizing only the exposed region of the main surface of the semiconductor substrate to selectively form a silicon carbide film on the exposed region, after formation of the gate electrode;

depositing a silicon film on said silicon carbide film of said region; and forming source/drain regions by implanting and diffusing an impurity into the main surface of said semiconductor substrate through said silicon carbide film and said silicon film deposited on the silicon carbide film with the gate electrode used as a mask, said silicon film deposited on said silicon carbide film is a single crystalline film having a dislocation density of at least $10^8 cm^{-2}$.

11. The method of manufacturing a semiconductor device according to claim 10, further comprising the step of forming extension regions in predetermined regions for forming said source/drain regions, said step being performed after formation of said silicon carbide film and before deposition of said silicon film on the silicon carbide film.

12. The method of manufacturing a semiconductor device according to claim 11, further comprising the step of lowering the resistance of the surface of said deposited silicon film.

13. The method of manufacturing a semiconductor device according to claim 12, wherein the step of lowering the resistance of the surface of said deposited silicon film includes a step of depositing a metal film on the surface of the deposited silicon film.

14. The method of manufacturing a semiconductor device according to claim 10, further comprising the step of forming a side wall insulating film on the side surface of said gate electrode.

15. The method of manufacturing a semiconductor device according to claim 10, wherein said silicon carbide film has a film thickness of 0.1 to 10 nm.

* * * * *

UNITED STATES PATENT AND TRADEMARK OFFICE
CERTIFICATE OF CORRECTION

PATENT NO. : 6,713,359 B1
DATED : March 30, 2004
INVENTOR(S) : Mizushima et al.

Page 1 of 1

It is certified that error appears in the above-identified patent and that said Letters Patent is hereby corrected as shown below:

Column 13,
Line 1, change "epositing" to -- depositing --.

Column 14,
Line 16, after "mask," insert -- wherein --.
Line 27, change "claim 11," to -- claim 10, --.

Signed and Sealed this

Twenty-fifth Day of May, 2004

JON W. DUDAS
*Acting Director of the United States Patent and Trademark Office*